(12) United States Patent (10) Patent No.: US 9,435,951 B2
Fournier et al. (45) Date of Patent: Sep. 6, 2016

(54) METHOD FOR MANUFACTURING A WAVEGUIDE INCLUDING A SEMI-CONDUCTING JUNCTION

(71) Applicant: Commissariat A L'Energie Atomique et aux Energies Alternatives, Paris (FR)

(72) Inventors: Maryse Fournier, Saint Martin d'Uriage (FR); Daivid Fowler, Saint Martin le Vinoux (FR); Edouard Grellier, Grenoble (FR); Lorenzo Iotti, St Martin d'Heres (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/953,773

(22) Filed: Nov. 30, 2015

(65) Prior Publication Data

US 2016/0154180 A1 Jun. 2, 2016

(30) Foreign Application Priority Data

Dec. 1, 2014 (FR) ..................... 14 61708

(51) Int. Cl.
*H01L 21/00* (2006.01)
*G02B 6/134* (2006.01)
(Continued)

(52) U.S. Cl.
CPC ............. *G02B 6/1347* (2013.01); *G02B 6/136* (2013.01); *G02B 6/1342* (2013.01); *G02F 1/025* (2013.01); *G02F 1/2257* (2013.01);
(Continued)

(58) Field of Classification Search
CPC .............. H01L 2223/6627; H01L 2223/6633
See application file for complete search history.

(56) References Cited

U.S. PATENT DOCUMENTS

2009/0039361 A1* 2/2009 Li ..................... H01L 21/02381
257/94
2012/0256318 A1* 10/2012 Sawada ............... H01L 25/0657
257/773
(Continued)

FOREIGN PATENT DOCUMENTS

GB 2 477 131 7/2011
WO WO 2014/103432 A1 7/2014

OTHER PUBLICATIONS

French Preliminary Search Report issued Jul. 31, 2015 in French Application 14 61708, filed on Dec. 1, 2014 ( with English Translation of Categories of Cited Documents).

*Primary Examiner* — Ngan Ngo
(74) *Attorney, Agent, or Firm* — Oblon, McClelland, Maier & Neustadt, L.L.P.

(57) ABSTRACT

The invention relates to a method for manufacturing a waveguide (40) including a semiconducting junction (23). The method comprises the following steps: providing a support (10) comprising a semiconducting layer (20) having a first part (21) of a first conductivity type ; protecting the first part ; selectively implanting a second conductivity-type dopants in a second part (22) of the semiconducting layer (20) adjacent to the first part (21, 221). The concentration of second conductivity-type dopants in the second part (22, 222) is greater than the one of first conductivity-type dopants in the first part (21, 221). The method further comprises the steps of: diffusing second conductivity-type dopants in the first part (21, 221) to form a semiconducting junction (23, 223) in the first part (21, 221), and partially etching the semiconducting layer (20, 200) to form the waveguide (40, 240) in the first part (21, 221), the protection of the first part (21, 221) being used so that the semiconducting junction (23, 223) is included in the waveguide (40, 240).

11 Claims, 7 Drawing Sheets

(51) Int. Cl.
  *G02B 6/136* (2006.01)
  *G02F 1/025* (2006.01)
  *G02F 1/225* (2006.01)
  *G02F 1/21* (2006.01)
(52) U.S. Cl.
  CPC  *G02F 2001/212* (2013.01); *H01L 2223/6627* (2013.01); *H01L 2223/6633* (2013.01)

(56) References Cited

U.S. PATENT DOCUMENTS

2013/0058606 A1   3/2013  Thomson et al.
2015/0311376 A1*  10/2015  Yu .................... H01L 31/111
                                              257/432

* cited by examiner

METHOD FOR MANUFACTURING A WAVEGUIDE INCLUDING A SEMI-CONDUCTING JUNCTION

TECHNICAL FIELD

The invention relates to the fields of microelectronics and optoelectronics and more particularly relates to the methods for manufacturing semiconducting structures for integrated optoelectronics, such as optical modulators.

STATE OF PRIOR ART

The optical modulators, such as the Mach-Zehnder or resonant ring-type modulators, usually integrate a waveguide the optical properties of which can be modulated.

Such a waveguide the optical properties of which can be modulated is usually provided by a semiconducting waveguide into which a semiconducting junction has previously being included. Indeed, the optical properties of such a waveguide, such as the effective index, can be easily modulated by adequately polarizing the semiconducting junction.

A conventional method for manufacturing such a waveguide consists in implementing the following steps:
  providing a support including a semiconducting layer, at least one first part of the layer having a first conductivity type,
  selectively implanting dopants of a second conductivity type opposite to the first type in a second part of the semiconducting layer adjacent to the first part so as to form a semiconducting junction between both parts,
  partially etching the layer so as to form the waveguide, the etching being made so that the semiconducting junction is included in the waveguide.

These two latter steps both necessarily involve a procedure of masking the semiconducting layer, in order to position the implantation area of the first conductivity type and the waveguide during etching. But the junction must be positioned in proximity to the centre of the waveguide, which prevents any reuse of the masks used during the implantation to perform the etching. Thus, the masking procedure during the step of etching is necessarily made with an alignment of the etching mask with respect to the previously implanted junction.

This alignment, due to the sizing of the waveguide and because the junction must be accurately positioned with respect to the centre of the waveguide, is relatively complex to set up and drastically increases the manufacturing cost of such a waveguide.

Document US20130058606 A1 teaches that it is possible, by implanting the junction after forming the waveguide, to use the masking used during the step of etching in order to define the location of the junction.

The method described in this document thus consists in implementing the following main steps:
  providing a support including a semiconducting layer, at least one first part of the layer having a first conductivity type,
  partially etching the layer so as to form the waveguide in the first part of the layer,
  selectively implanting a second part of the remaining semiconducting layer after etching, the waveguide being protected during implanting by the mask previously used during etching so that the second implanted part is adjacent to the guide;
  thermal treatment to activate the dopants, said treatment leading to a low diffusion of the junction inside the waveguide.

Thus, the formed junction is perfectly positioned with respect to the waveguide without requiring an accurate alignment of the mask. Manufacturing a waveguide with such a method has therefore a reduced cost with an increased accuracy of the positioning of the junction with respect to the waveguide.

Nevertheless, if such a method enables a good control of the positioning of the junction with respect to the waveguide without drastically increasing the manufacturing cost, the junction inevitably lies in proximity to a wall of the waveguide and is therefore remote from the centre of the waveguide. But, to achieve an optimized operation of the waveguide and a maximum modulation of the optical property at the centre of the waveguide with limited optical losses, it is necessary for the junction to be positioned in proximity to the centre of the waveguide. It is moreover to be noted that diffusing the dopants during the step of activating does not allow a vertical junction to be obtained. Indeed, since the diffusion occurs from the lower edge of the waveguide, the junction resulting from this diffusion remains centred with respect to the same lower edge.

DISCLOSURE OF THE INVENTION

The aim of the invention is to resolve this drawback and the object thereof is to make possible to provide a waveguide at least one optical property of which can be modified, without requiring, to provide the waveguide with an accurate positioning of the junction in proximity to the centre of the waveguide, any significant additional cost related to the alignment of the mask.

The aim of the invention is further to provide such a waveguide with an orientation of the junction substantially transverse with respect to the plane of the support of said waveguide, this corresponding, in a conventional configuration, to a vertical orientation of the junction.

To this end, the invention relates to a method for manufacturing a waveguide including a semiconducting junction, said method comprising the following steps:
  providing a support comprising a semiconducting layer having at least one first part of a first conductivity type comprising a concentration of first conductivity-type dopants,
  protecting the first part of the semiconducting layer,
  selectively implanting dopants of a second conductivity type opposite to the first conductivity type in a second part of the semiconducting layer, the implantation selectivity being achieved by means of the protection of the first part so that the second part is adjacent to the first part, the implantation being made so that the concentration of second conductivity-type dopants in the second part is greater than the one of first conductivity-type dopants in the first part,
  diffusing second conductivity-type dopants in the first part to form a semiconducting junction in the first part,
  partially etching the semiconducting layer to form the waveguide in the first part, the protection of the first part being used during this etching to bound a first side wall of the waveguide at the interface between the first and the second parts so that the semiconducting junction is included in the waveguide.

With such a method, positioning the junction with respect to the first side wall of the waveguide is determined by the diffusion length of the second conductivity-type dopants in the first part. Thus, with an adapted diffusion of the second conductivity-type dopants, it is possible to achieve an optimum positioning of the junction with respect to the first wall and therefore to the centre of the waveguide. Such a method then enables the junction to be positioned in proximity to the centre of the waveguide. Moreover, since the diffusion occurs from the vertical interface between the first and the second part, the final orientation of the junction in the waveguide is also vertical, that is transverse with respect to the support of the waveguide.

It is also to be noted that the optimum positioning and orientation of the junction with respect to the centre of the waveguide does not lead to any significant additional cost as is the case for the prior art methods since the alignment of the mask for etching is mainly achieved by reusing the protection used during implanting.

It is to be noted that, of course, if the semiconducting layer has a first part of a first conductivity type, this characteristics does not predict the conductivity type of the remainder of the semiconducting layer at all. Thus, it can be contemplated within the scope of the invention that the remainder of the semiconducting layer is totally or partially of the first conductivity type or even that the remainder of the semiconducting layer is of the second conductivity type or of the intrinsic type.

The manufacturing method being a method for manufacturing a waveguide of a width W, the concentration of second conductivity-type dopants implanted during the implanting step can be adapted so that during the step of diffusing the second conductivity-type dopants in the first part, diffusion occurs from the interface between the first and the second parts over a distance between 10 and 70% of the width W, preferentially between 30 and 50% of the width W.

With such an adaptation of the concentration of the second conductivity-type dopants, a simple annealing during the step of diffusion enables an adequate placing of the junction to be provided for the inclusion thereof in the waveguide. Indeed, with such a concentration, the annealing conditions, if they are sufficient to allow a maximum diffusion of the dopants, do not need to be perfectly controlled. It is the concentration of dopants in the first and the second parts of the semiconducting layer which defines the distance of diffusion.

The ratio of the concentration of second conductivity-type dopants implanted in the second part to the one of the first conductivity-type dopants in the first part may be between 2 and 30 and is preferentially between 4 and 15.

With an implantation of second conductivity-type dopants during the step of implanting, it is possible to provide an optimum placing of the semiconducting junction through a step of diffusing consisting in a simple annealing enabling a maximum diffusion of the second conductivity-type dopants to be provided.

Upon providing the support, the area of the layer which is intended to form the second part can also be of the first conductivity type and include a concentration of first conductivity-type dopants substantially identical to the one of the first part.

During the step of protecting the first part, a first mask can be deposited which protects the area of the first part intended to form the waveguide during the steps of implanting and etching and a second mask can also be deposited which protects the remainder of the first part during implanting, the method including, prior to the step of etching, a step of removing the second mask.

The use of two protecting elements, a first mask protecting the area of the first part intended to form the waveguide and a second mask protecting the remainder of the first part, enables a simplified use of the protection during the step of partial etching. Indeed, a selective removal of the second protecting element enables an adequate protection to be achieved to protect the area intended to form the waveguide during the step of partial etching.

The support can be a semiconductor-on-insulator-type support, the semiconducting layer being the semiconducting layer on insulator of the support.

Such a support is particularly adapted to provide a good quality waveguide, the insulating layer contributing to confining the electromagnetic wave passing through the waveguide.

The semiconducting layer can be a silicon layer.

Such a layer is particularly adapted for obtaining a waveguide having good optical characteristics for the electromagnetic waves in the infrared range.

The ones among the first and second conductivity-type dopants can be selected from the group comprising boron, aluminium and indium, whereas the others among the first and second conductivity-type dopants can be selected from the group including phosphorus, arsenic and antimony, the first and second conductivity-type dopants being preferentially boron for the ones and phosphorus for the others.

The step of diffusing can consist in applying a thermal annealing to the support adapted to achieve a diffusing distance of the second conductivity-type dopants in the first part which is maximum.

Thus, the diffusing distance is perfectly defined since this distance is determined by the concentration of the implanted second conductivity-type dopants.

The invention further relates to a method for manufacturing an optoelectronic component having a waveguide including a semiconducting junction, the manufacturing method comprising the steps for manufacturing a waveguide according to the invention.

Such a method makes it possible to enjoy advantages related to the method for manufacturing a waveguide according to the invention.

The optoelectronic component can be an optical modulator such as a Mach-Zehnder-type or resonant ring-type modulator.

Such an optical modulator particularly enjoys the possibility given by the method for manufacturing a waveguide according to the invention.

BRIEF DESCRIPTION OF THE DRAWINGS

The present invention will be better understood upon reading the description of exemplary embodiments, given by way of purely indicating and in no way limiting purposes, with reference to the appended drawings in which.

Identical, similar or equivalent parts of the different figures bear the same reference numerals so as to facilitate switching from one figure to the other.

The different parts represented in the figures are not necessarily drawn to a uniform scale, in order to make the figures more understandable.

The different possibilities (alternatives and embodiments) must be understood as being not mutually exclusive and can be combined to each other.

DETAILED DISCLOSURE OF PARTICULAR EMBODIMENTS

FIGS. 1A to 1D illustrate the main steps for manufacturing a waveguide 40 according to the invention having optical properties which can be modulated and which is able to be comprised in a component such as a Mach-Zehnder-type or ring-type optical modulator.

Figure 1A:
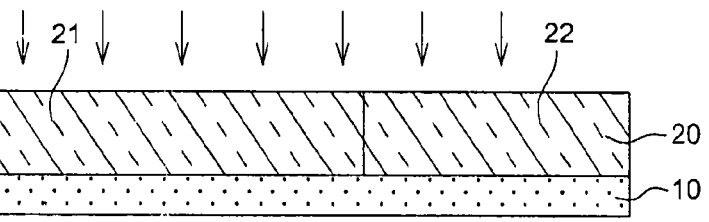
FIGS. 1A to 1D illustrate the steps for manufacturing a waveguide according to the principle of the invention, said waveguide including a semiconducting junction.
Figure 1B:
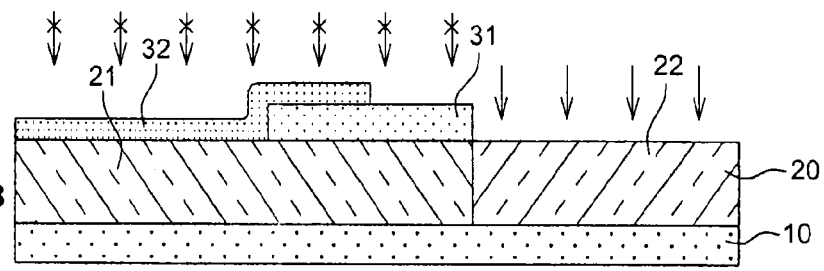
Figure 1C:
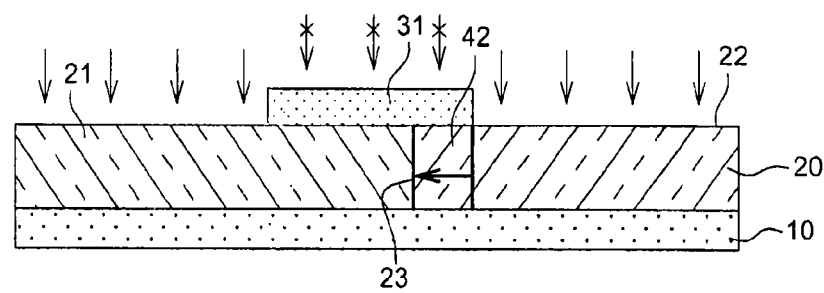
Figure 1D:
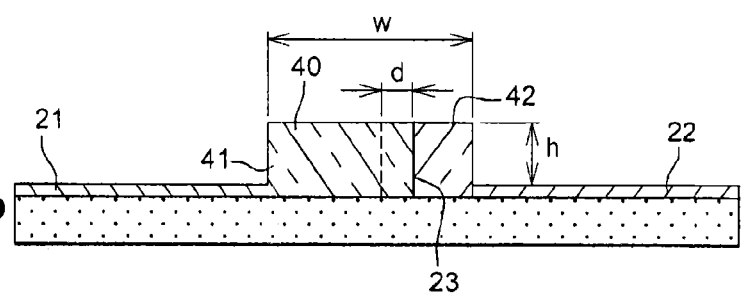

Thus, according to the principle of the invention illustrated schematically and in a transverse cross-section in FIG. 1D, a component 1 having such a waveguide 40 includes a support 10, such as here, a silicon substrate on which an insulator layer is disposed according to the silicon-on-insulator principle, more commonly known as the acronym SOI, only the insulating layer being represented.

Said support 10 comprises a semiconducting layer 20 having a first part 21 mainly of a first conductivity type and a second part 22 of a second conductivity type adjacent to the first part 21, the first part having, in proximity to the second part 22, a portion of the second conductivity type so that a semiconducting junction 23 is formed in the first part 21 in proximity to the second part 22.

For the purpose of clarity and by means of illustration, in the continuation of the description of the invention, the first conductivity type is defined as the conductivity type for which the majority carriers are holes, the latter being referred to by convenience as "P-type", whereas the second conductivity type is defined as the conductivity type for which the majority carriers are electrons, the latter being referred to by convenience as "N-type". Thus, a portion having the first and second conductivity types is respectively referred to as P-doped and N-doped. Of course, this choice does not limit whatsoever the scope of the invention since the first and second conductivity types can be reversed without departing from the scope of the invention.

The semiconducting layer 20 comprises, as illustrated in FIG. 1D, the waveguide 40 provided therein so that the junction 23 is included in the waveguide 40. The waveguide is formed by an extra thickness of the semiconducting layer 20 which protrudes from the remainder of the semiconducting layer 20 over a height h which can be between 100 and 500 nm. The width W of the waveguide can be between 100 and 500 nm. The waveguide extends along a direction which is referred to as longitudinal as opposed to its lateral direction along which the cross-section illustrated in FIG. 1D is made. This longitudinal direction can be, as a function of the component fitted with a waveguide 40, linear, curvilinear, and even ring-shaped.

The waveguide 40 comprises a first portion 41 of the first P-doped part 21 and a second portion 42 of the first part 21 which is the N-doped portion. The interface between the first and the second portions 41, 42 of the waveguide then forms the junction 23. The first and the second portions 41, 42 and the junction 23 are longitudinal and all three extend along the longitudinal direction of the waveguide 40.

Along the transverse direction, the junction 23 is positioned at a distance d from the centre of the waveguide 40.

The distance d is between 0 and 45% of the width W of the waveguide, that is 0 and 90% of the half-width W/2.

The method for manufacturing such a waveguide 40 comprises the following steps:

providing, as illustrated in FIG. 1A, the support 10 comprising the semiconducting layer 20 comprising at least one first P-doped part 21 with a first concentration of P-type dopants, protecting the first part 21 of the semiconducting layer 20, selectively implanting, as illustrated in FIG. 1B, N-type dopants in a second part 22 of the semiconducting layer 20, the implantation selectively being achieved by means of protecting the first part 21 so that the second part 22 is adjacent to the first part 21, the implantation being made so that the concentration of N-type dopants is greater than the one of P-type dopants in the first part 21, diffusing, as illustrated in FIG. 1C, N-type dopants in the first part 21 to form a semiconducting junction 23 in the first part 21, partially etching, as illustrated in FIG. 1D, the semiconducting layer 20 to form the waveguide 40 in the first part 21, the protection of the first part 21 being used during this etching to bound a first side wall of the waveguide 40 at the interface between the first and second parts 21, 22 so that the semiconducting junction 23 is included in the waveguide.

In an exemplary practical embodiment of the invention, the support 10 is a silicon-on-insulator-type support, the silicon layer of such a support forming the semiconducting layer 20. The step of providing the support 10 according to this example includes a first sub-step of providing a silicon-on-insulator-type support with the surface silicon layer being non-intentionally doped.

According to this same practical embodiment, forming the first part 21 of the P-doped semiconducting layer 20 is made by a sub-step of implanting the semiconducting layer 20 with P-type dopants. These dopants can be boron. The implantation is made by ion implantation with a dopant dose of $1 \times 10^{13}$ cm$^{-2}$ and an implantation energy of 46 KeV. This way, the whole semiconducting layer 20, including its first part 21, is P-doped.

The step of protecting the first part 21 can be performed by means of two different masks 31, 32, a first mask 31 protecting the area of the first part 21 which will form, after etching, the waveguide 40, this first mask 31 being, in FIG. 1B, a hard mask, and a second mask 32, of the resin type or any type of material having an etching selectivity with respect to the mask 31 and the semiconducting layer 20, protecting the remainder of the first part 21 which is not protected by the first mask 31. The first mask 31 is sized, for the practical exemplary embodiment, to form a waveguide 40 with a width of 320 nm.

It can be seen in FIG. 1B that placing the second mask 32 with respect to the first mask 31 does not require an accurate alignment operation since the overlapping area of the second mask 32 on the first mask 31 enables a possible misalignment of the second mask 32 with respect to the first mask 31 to be counterbalanced.

The first and second masks 31, 32 enable the first part 21 of the semiconducting layer 20 to be protected during the step of implanting the second part 22.

In the exemplary practical embodiment, the implanted second conductivity-type dopants are phosphorus. Implanting is made by ion implantation with a dopant dose strictly greater than $1 \times 10^{13}$ cm$^{-2}$, and equal to or lower than $1 \times 10^{15}$ cm$^{-2}$, and an implantation energy of 130 KeV. This way, implanting the second part 22 is made with a concentration of dopants greater than the one of the first part 21 since a concentration of $7\times10^{17}$ cm$^{-3}$ is obtained in the first part 21, apart from the waveguide, and of $7\times10^{17}$ to $1\times10^{19}$ cm$^{-3}$, in the second part 22.

Such a difference in the concentration of dopants between the first and the second parts 21, 22 enables, with the annealing conditions of the step of diffusing, the distance D along which the P-type dopants diffuse in the first part 21 to be defined. Such a distance can be referred to as, to simplify, a diffusion distance of the junction.

Figure 2:
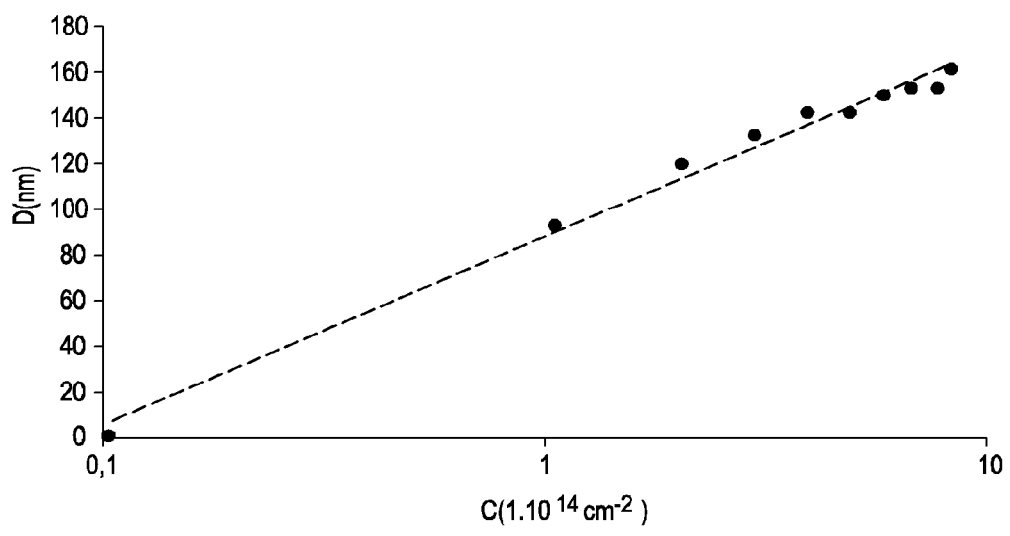
FIG. 2 is a graph showing the displacement of the junction as a function of the concentration of implanted dopants during the step of implanting, FIGS. 3A to 3D respectively and graphically illustrate the variation in the concentration of the first and second conductivity-types dopants along a transverse cross-section of four respective waveguides obtained by implanting second conductivity-type dopants with different concentrations.

FIG. 2 then illustrates the diffusion distance D of the junction 23 as a function of the dose C implanted with N-type dopants within the scope of the exemplary practical embodiment. This graph shows that for a reference value in which the dose of dopants in the second part 22 is identical to the one of the first area, that is equal to $1\times10^{13}$ cm$^{-2}$, the N-type dopants hardly diffuse, or even do not diffuse at all. The diffusion distance of the junction for this dose is therefore 0 nm.

When the implanting dose of N-type dopants becomes greater than the one of P-type dopants in the first part 21, the annealing enables a diffusion to be achieved. This diffusion is all the more significant that the ratio of the dose of N-type dopants to the one of P-type dopants increases. This diffusion varies in a substantially logarithmic way with this ratio, and therefore with the implanted dose of phosphorous, as illustrated in FIG. 2.

It is this variation which is illustrated in FIGS. 3A to 3D. Indeed, FIGS. 3A to 3D respectively represent the variation in concentration of dopants C' along a transverse cross-section for a waveguide after diffusion for a respective implantation of $1\times10^{13}$ cm$^{-2}$, $1.2\times10^{14}$ cm$^{-2}$, $2.3\times10^{14}$ cm$^{-2}$ and $1\times10^{15}$ cm$^{-2}$ of phosphorus in the second part of the semiconducting layer, and a dose of $1\times10^{13}$ cm$^{-2}$ of boron in the first part 21. The junction 23 is thus respectively positioned at 720 nm, 625 nm, 595 nm, and 550 nm. Knowing that the walls of the waveguide are respectively positioned at 720 and 400 nm, these positions correspond to a respective positioning with respect to the centre of the waveguide 40 of 100%, 46%, 21%, and −6% of the half-width W/2 of the waveguide 40 according to the particular exemplary embodiment. It is thus possible with a simple variation in the dose of dopants implanted in the second part 22 to define the positioning of the junction with respect to the centre of the waveguide.

Figure 3A:
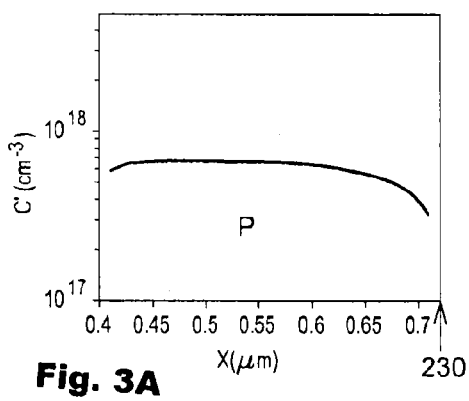
Figure 3B:
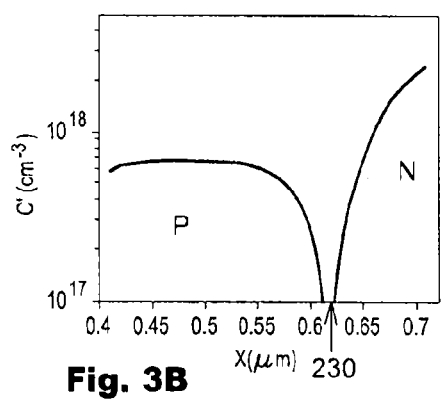
Figure 3C:
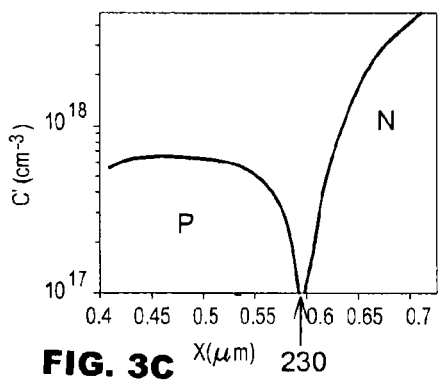
Figure 3D:
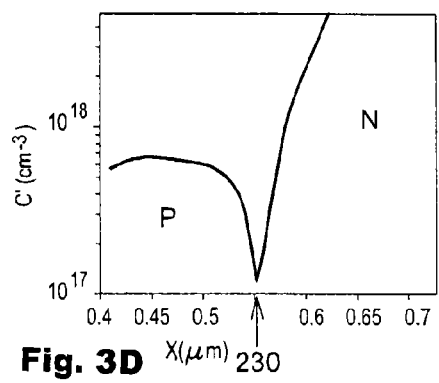

With the configuration described in the exemplary embodiment, a positioning d of the junction with respect to the centre of the waveguide 40 of 10% to 20% of the width of the waveguide, that is 20% to 40% of the half-width W/2, can be considered as optimum to enable a proper modulation of the optical characteristics of the waveguide 40 while limiting the optical losses. Such a positioning can therefore be achieved, as shown in FIG. 3C and 3B, for a phosphorus dose between $1.2\times10^{14}$ cm$^{-2}$ and $2.3\times10^{14}$ cm$^{-2}$ and a boron dose of $1\times10^{13}$ cm$^{-2}$. This corresponds to a factor in the order of 10 to 20 with respect to the boron dose which has been implanted in the first part 21 of the semiconducting layer 20, which results in a ratio of concentration of dopants in the first and the second parts 21, 22 before diffusion of 4 to 6. It will be noted that a positioning d of the junction with respect to the centre of the waveguide 40 of 20% of the half-width of the waveguide is to be preferred, and therefore a factor of 10 with respect to the boron dose is advantageous for the phosphorus dose. Such a dose ratio corresponds to a ratio of the concentration of dopants in the first and the second parts 21, 22 before diffusion of 4.

After implanting the second part 22 of the semiconducting layer 20, the step of diffusing can be made through annealing the support 10/semiconducting layer 20 assembly at 1050° C. during 10s. Such an annealing is sufficient for the diffusion distance of the N-type dopants in the first part 21 to be maximum. A maximum diffusion of the junction 23 in the first part 21 of the semiconducting layer 20 is then also achieved, the junction 23 being positioned in the first part 21 of the semiconducting layer 20.

The step of partial etching, such as illustrated in FIG. 1D, includes the following sub-steps:
   removing the second mask 32 so as to leave protected only the area of the first part 21 lying under the first mask 31 and which is intended to be included in the waveguide 40, the junction 23 being in the area protected by the first mask 31,
   etching the non-protected areas of the semiconducting layer 20 over a height h so as to form the waveguide 40,
   removing the first mask 31.

The sub-step of etching can also be a wet etching, such as by etching by means of an acid, or a dry etching, such as by reactive ion etching. Moreover, since the area of the semi-conducting layer intended to form the waveguide is protected by the first mask 31, the protection of the first part is then used during etching in order especially to bound a first side wall of the waveguide 40 at the interface between the first and the second parts 21, 22.

Thus, since the junction 23 is included in the area of the semiconducting layer 20 protected by the first mask 31, it is included in the waveguide 40. Furthermore, the location of the walls of the waveguide is defined by the first mask 31 with one of those which corresponds to the interface between the first and the second parts 21, 22. As a result, the positioning of the junction 23 defined by diffusing N-type dopants from the interface between the first and the second parts 21, 22, is also defined with respect to the wall of the waveguide 40 corresponding to the same interface.

The positioning of the junction 23 in the waveguide 40 is therefore perfectly defined without having required a demanding step of aligning the mask.

Figure 4A:
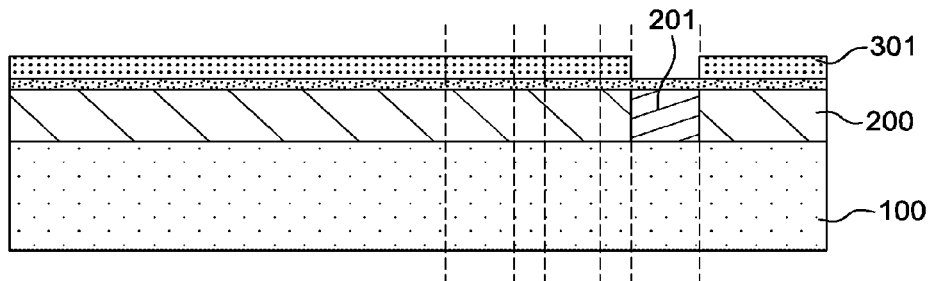
FIGS. 4A to 4N illustrate the main steps for manufacturing a semiconducting component, such as a modulator, including a waveguide according to the invention.

Such a method can be implemented for manufacturing an optoelectronic component such as an optical modulator either of the Mach-Zehnder-type or of the resonant ring-type. FIGS. 4A to 4N actually illustrate the integration of a method for manufacturing a waveguide according to the invention as part of the manufacture of an optoelectronic component 1 including such a waveguide. This component includes an optical modulator such as a Mach-Zehnder or resonant ring-type optical modulator.

Said component 1 includes, as illustrated in FIG. 4N:
   a coupling network 2, such as a grating coupler, adapted to receive an electromagnetic radiation at a given wavelength,
   a first waveguide 3,
   a second waveguide 4, said second waveguide 4 being a waveguide according to the invention and thus includes a junction 223, said second waveguide 4 further comprising contacts 204, 205 to enable a polarization of its junction 223 and a resistive element 206 forming a heating system to make it possible to counterbalance the temperature variations which could lead to a shift in its optical response,
   a photodiode 5 adapted to receive a radiation.

It is to be noted that if FIGS. 4A to 4N illustrate transverse cross-section views, these different elements of the component illustrated in FIG. 4N are of course in three dimensions and therefore have connections to each other which are not present in the cross-section plane.

Thus, in the case where the optical modulator is of the Mach-Zehnder-type, the coupling network 2 is optically connected to the first and the second waveguides 3, 4 so that the latter each form one of the branches of a Mach-Zehnder-type optical modulator, the output of the thus formed modulator being itself optically connected to the photodiode 5.

In the case where the modulator is of the resonant ring-type, the coupling network 2 is optically connected to the first waveguide 3, the latter being optically coupled to the second waveguide 4 which forms a resonant ring. The output of the first waveguide, therefore the one of the optical modulator, is optically connected to the photodiode 5.

Figure 4B:
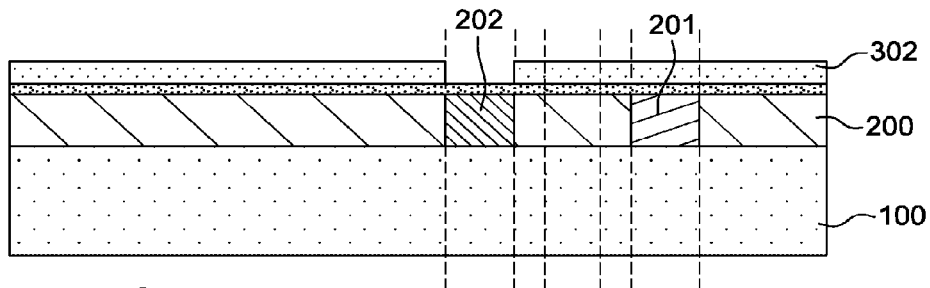
Figure 4C:
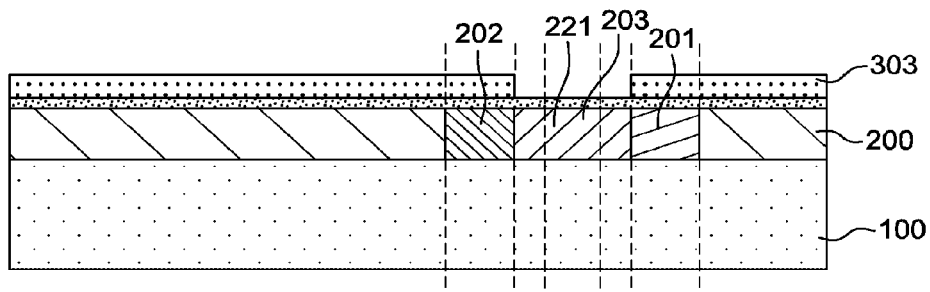
Figure 4D:
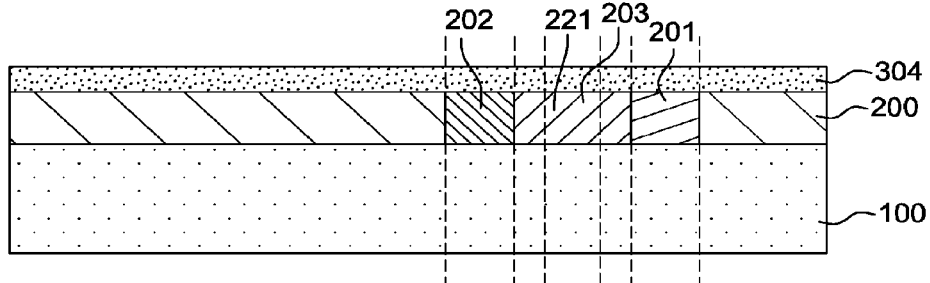
Figure 4E:
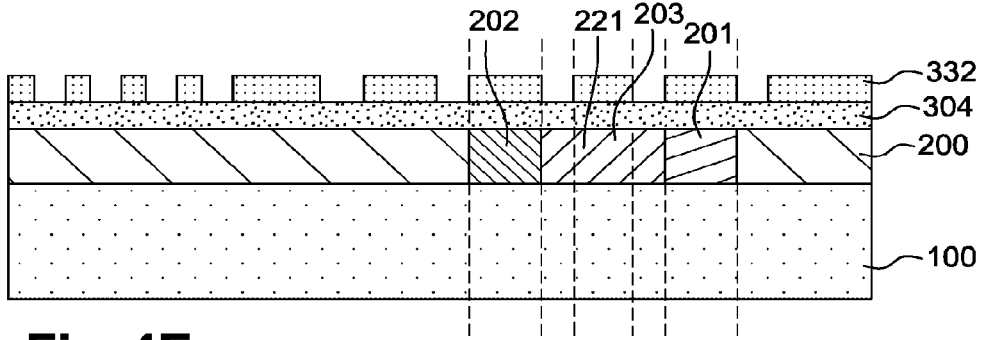
Figure 4F:
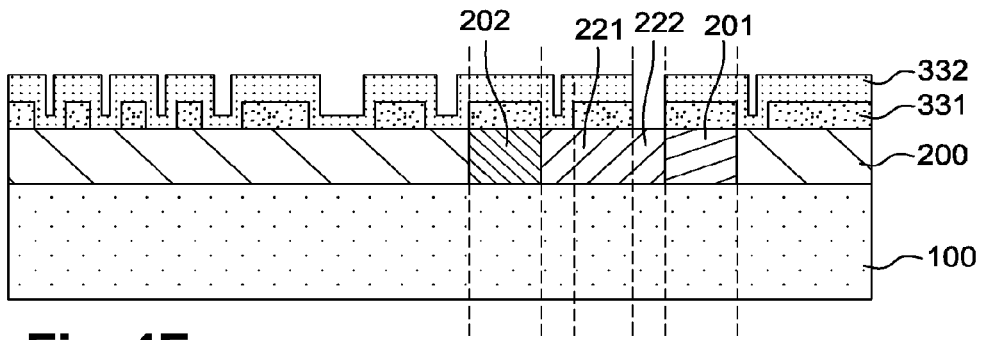
Figure 4G:
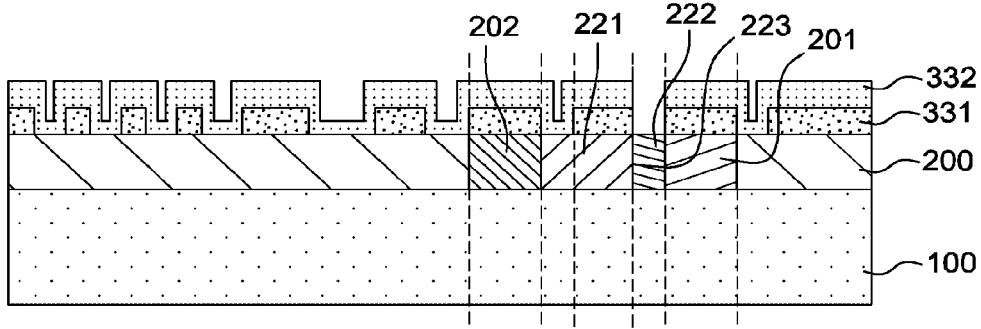
Figure 4H:
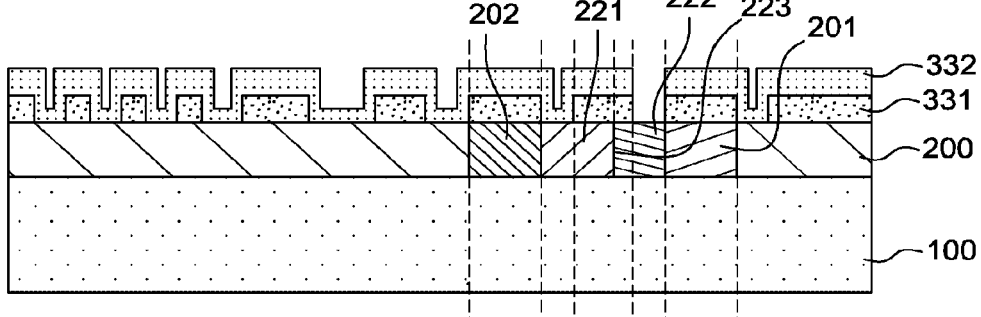
Figure 4I:
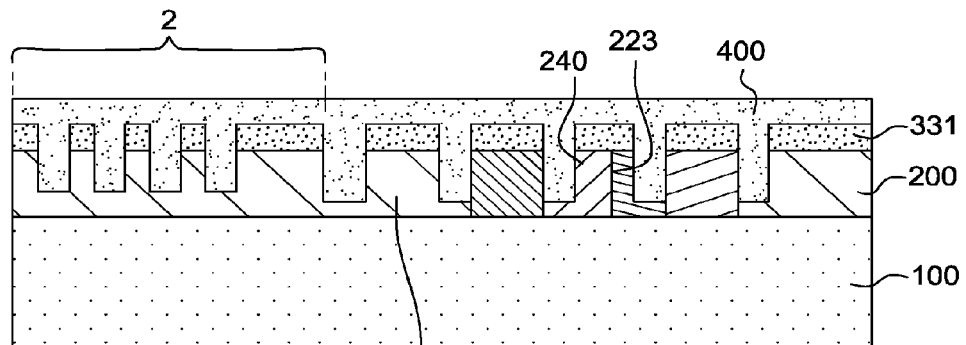
Figure 4J:
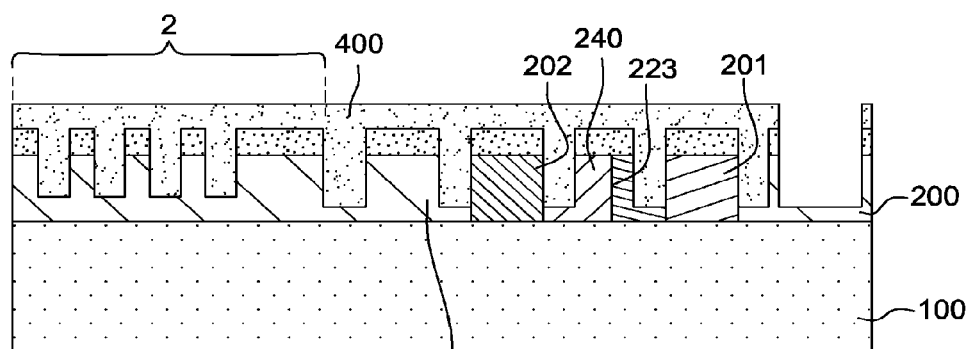
Figure 4K:
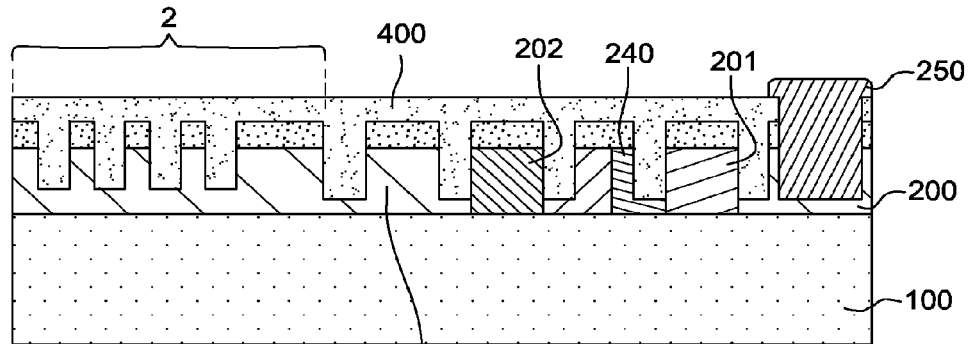
Figure 4L:
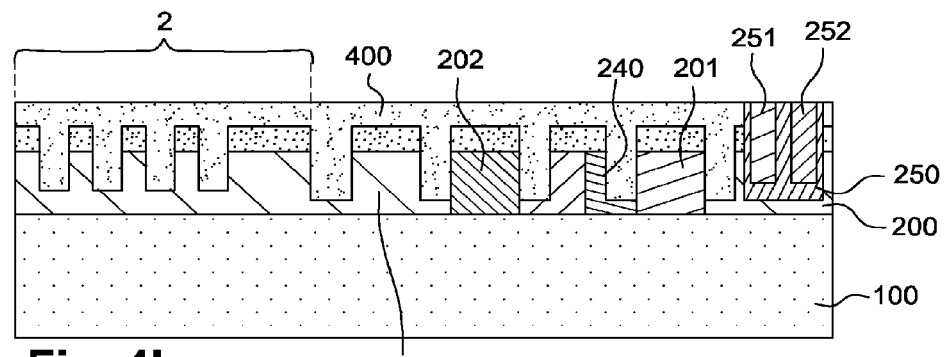
Figure 4M:
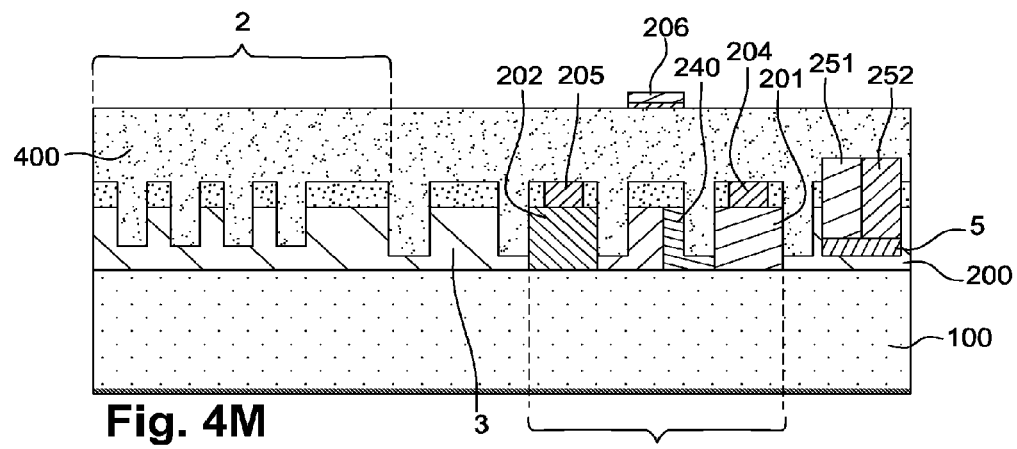
Figure 4N:
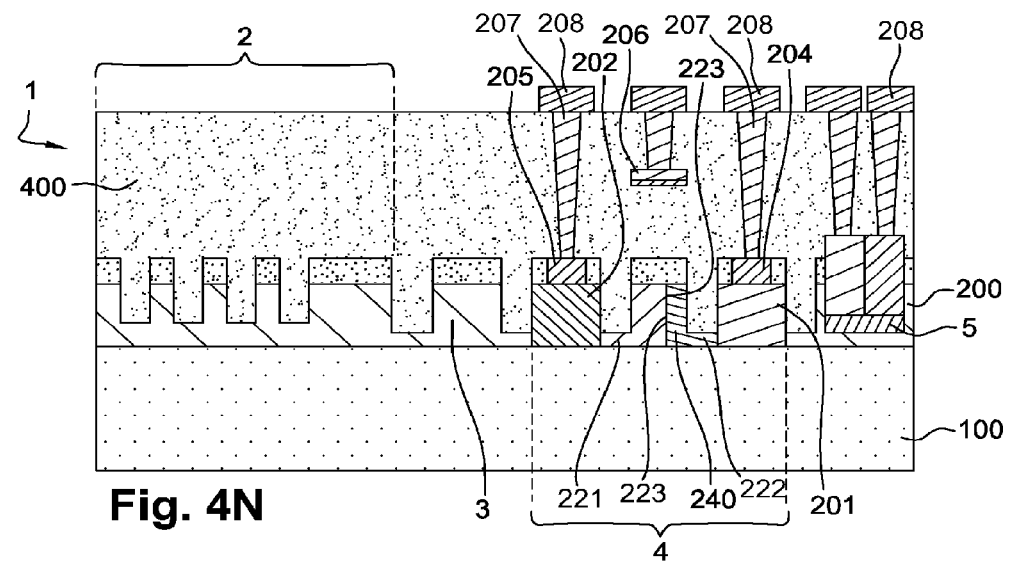

A method for manufacturing such a component includes the following steps:
- providing an SOI-type semiconducting support 100, the semiconducting layer 200 including a silicon dioxide shield at its surface,
- depositing a mask 301, said mask including an aperture for forming a first P-doped area 201 in the semiconducting layer 200,
- implanting P-type dopants in the area 201 of the non-protected semiconducting layer, such as illustrated in FIG. 4A,
- removing the mask 301 and depositing another mask 302, said other mask 302 including an aperture for forming a second N-doped area 202,
- implanting N-type dopants in the area 202 of the semiconducting layer 200 not protected by the mask 302, as illustrated in FIG. 4B,
- removing the mask 302 and depositing another mask 303, so as to enable the deposit on an area 203 of the semiconducting layer 200 comprised between the previously implanted areas 201, 202, said area 203 comprising a first part 221 of the semiconducting layer 200,
- implanting P-type dopants in the area 203 of the semiconducting layer not protected by the mask 302, said area 203 including the first part 221 of the semiconducting layer 200, such as illustrated in FIG. 4C,
- removing the mask 303 and depositing the layer 304 able to form a first hard mask, such as illustrated in FIG. 4D,
- depositing a second mask 332 on the layer able to form a first hard mask 331, this second mask 332 including apertures in order to etch the layer 304 to form the first mask 331, as illustrated in FIG. 4E,
- selectively etching the layer 304 able to form the first mask 331 through the second mask 332 so as to transfer the apertures of the second mask 332 in said layer 304 and thus form the first mask 331,
- adding an additional portion of the material forming the second mask 332 so as to complete the second mask 332, this addition being made so as to protect the first part 221 of the semiconducting layer 200 and so as to leave free a second part 222 of the semiconducting layer 200, as illustrated in FIG. 4F, such a step thus consists in protecting the first part 221 of the semiconducting layer 200,
- selectively implanting N-type dopants in the second part 222 of the semiconducting layer 200, the implantation selectivity being achieved by means of the first and the second masks 331, 332, the implantation being made so that the concentration of N-type dopants in the second part 222 is greater than the one of P-type dopants in the first part 221, as illustrated in FIG. 4G,
- diffusing the N-type dopants in the first part 221 to form a semiconducting junction 223 in the first part 221, as illustrated in FIG. 4H,
- removing the second mask 332,
- partially etching the semiconducting layer 200 over a height h through the first mask 331 in order to transfer the apertures of the first mask 331 on the semiconducting layer 200, said selective etching enabling the formation of the coupling network 2, the first waveguide 3 and the functional part 240 of the second waveguide 4, the latter being formed in the first part 221, the first mask 331 being used to bound a first side wall of the waveguide 4 at the interface between the first and the second parts 221, 222 so that the semiconducting junction 223 is included in the waveguide 4,
- depositing an insulator layer 400, as illustrated in FIG. 4I,
- partially etching the insulator layer 400 and the semiconducting layer 220 at an area of the semiconducting layer adjacent to the functional part 240 of the second waveguide 4 and which is opposite the coupling network 2, as illustrated by FIG. 4J,
- depositing germanium in the space freed during the partial etching so as to form a portion 250 of germanium, as illustrated in FIG. 4K,
- implanting P-type and N-type dopants respectively in the first and the second areas 251, 252 of the deposited portion of germanium 250, as illustrated in FIG. 4L,
- diffusing dopants in the portion of germanium 250 so as to form a semiconducting junction and obtain the photodiode 5,
- depositing an electrical contact 204, 205 on each of the adjacent areas 201, 202 of the waveguide 240 so as to enable a polarization of the junction 223 included in the waveguide by means of these two electrical contacts 204, 205,
- depositing an insulator layer,
- depositing a resistive element 206 overhanging the waveguide, said resistive element 205 being arranged to transmit heat to the waveguide when it carries a current so as to make it possible to counterbalance the thermal variations which could lead to a shift in the optical response of the waveguide, as illustrated in FIG. 4M,
- selectively etching the insulator layer 400 so as to form passages for vertical interconnections in order to connect the electrical contacts 204, 205 of the adjacent areas 201, 202 of the waveguide, the resistive element and both poles of the germanium photodiode,
- filling the passages formed in the insulator layer 400 so as to constitute vertical interconnections 207 to connect the adjacent areas 201, 202 of the waveguide, the resistive element 206 and both poles of the germanium photodiode 5,
- forming surface contacts 208 of the vertical interconnections 207, as illustrated in FIG. 4N.

A component 1 such as obtained by such a method, given by way of exemplary integration of the waveguide according to the invention, makes it possible to receive an electromagnetic wave on the coupling network 2, to make this electromagnetic wave pass through both waveguides 3, 4 with the possibility of modulating it by means of an adequate polarization of the second waveguide 4 and of measuring the thus modulated wave by means of the germanium photodiode 5. This shows that a method for manufacturing a waveguide 4 according to the invention can be easily integrated to a method for manufacturing a more complex optoelectronic component such as an optical modulator.

If according to the above-described embodiment, the support can be an SOI-type support with the semiconducting layer which is an intrinsic-type silicon-on-insulator layer, the support and the semiconducting layer it includes can be of another type without departing from the scope of the invention. Thus, the support can easily include a semiconducting layer of another type, such as germanium, silicon carbide or indium phosphorus. Of course, the first and second conductivity-type dopants are to be adapted as a function of the semiconducting material constituting the semiconducting layer. Since such adaptations are known from those skilled in the art, the latter is able to transpose the method according to the invention to these semiconducting materials by means of simple routing tests.

Thus, taking only the example of silicon, the first and second conductivity-type dopants can be selected in the group including boron, aluminium and indium whereas others among the first and second conductivity-type dopants are selected from the group including phosphorus, arsenic and antimony. These alternatives to boron and phosphorus are usual and those skilled in the art are perfectly able, from the teaching of this document and from their general knowledge, to adapt the method according to the invention to these different dopants.

The invention claimed is:

1. A method for manufacturing a waveguide including a semiconducting junction, the method comprising:
    providing a support comprising a semiconducting layer having at least one first part of a first conductivity type comprising a concentration of first conductivity-type dopants,
    protecting the first part of the semiconducting layer by providing a protection of the first part,
    selectively implanting dopants of a second conductivity type opposite to the first conductivity type in a second part of the semiconducting layer, the implantation selectivity being achieved by means of the protection of the first part so that the second part is adjacent to the first part, the implantation being made so that the concentration of second conductivity-type dopants in the second part is greater than the concentration of the first conductivity-type dopants in the first part,
    diffusing the dopants of the second conductivity type in the first part to form a semiconducting junction in the first part,
    after the steps of implanting and diffusing have been performed, partially etching the semiconducting layer to form the waveguide in the first part, the protection of the first part being used during this etching to bound a first side wall of the waveguide at the interface between the first and the second parts so that the semiconducting junction is included in the waveguide.

2. The manufacturing method according to claim 1 of a waveguide of a width W, wherein the concentration of the dopants of the second conductivity type implanted during the implanting step is adapted so that during diffusing the dopants of the second conductivity type in the first part, diffusion occurs from the interface between the first and the second parts over a distance between 10 and 70% of the width W.

3. The manufacturing method according to claim 2, wherein the ratio of the concentration of the dopants of the second conductivity type dopants implanted in the second part to the dopants of the first conductivity type dopants in the first part is between 2 and 30.

4. The manufacturing method according to claim 1, wherein during providing the support the area of the layer which is intended to form the second part is also of the first conductivity type and includes a concentration of the dopants of the first conductivity type substantially identical to the concentration of the first part.

5. The manufacturing method according to claim 1, wherein during the protecting the first part, a first mask is deposited which protects the area of the first part intended to form the waveguide during the steps of implanting and etching and a second mask is also deposited which protects the remainder of the first part during implanting, the manufacturing method comprising prior to the etching a removing the second mask.

6. The manufacturing method according to claim 1, wherein the support is a semiconductor-on-insulator-type support, the semiconducting layer being the semiconductor layer on insulator of the support.

7. The manufacturing method according to claim 1, wherein the semiconducting layer is a silicon layer.

8. The manufacturing method according to claim 7, wherein ones among the first and second conductivity-type dopants are selected from the group consisting of boron, aluminium and indium whereas others among the first and second conductivity-type dopants are selected from the group consisting of phosphorus, arsenic and antimony.

9. The manufacturing method according to claim 8, wherein the ones among the first and second conductivity-type dopants are boron, whereas the others among the first and second conductivity-type dopants are phosphorus.

10. A method for manufacturing an optoelectronic component having a waveguide including a semiconducting junction, wherein the manufacturing method comprises the method of manufacturing a waveguide according to claim 1.

11. The manufacturing method according to claim 10, wherein the optoelectronic component includes an optical modulator such as a Mach-Zehnder-type or resonant ring-type modulator.

* * * * *